(12) United States Patent
Lee (10) Patent No.: US 10,784,112 B2
(45) Date of Patent: Sep. 22, 2020

(54) WAFER POLISHING CHAMBER AND WAFER POLISHING SYSTEM INCLUDING SAME

(71) Applicant: SK SILTRON CO., LTD., Gumi-si, Gyeongsangbuk-do (KR)

(72) Inventor: Sang Ho Lee, Gumi-si (KR)

(73) Assignee: SK Siltron Co., Ltd., Gumi-si (KR)

( * ) Notice: Subject to any disclaimer, the term of this patent is extended or adjusted under 35 U.S.C. 154(b) by 293 days.

(21) Appl. No.: 15/753,808

(22) PCT Filed: Jan. 6, 2016

(86) PCT No.: PCT/KR2016/000081
§ 371 (c)(1),
(2) Date: Feb. 20, 2018

(87) PCT Pub. No.: WO2017/111196
PCT Pub. Date: Jun. 29, 2017

(65) Prior Publication Data
US 2019/0013205 A1    Jan. 10, 2019

(30) Foreign Application Priority Data

Dec. 24, 2015 (KR) .................. 10-2015-0186276

(51) Int. Cl.
*B24B 37/08* (2012.01)
*B24B 37/34* (2012.01)
(Continued)

(52) U.S. Cl.
CPC ............ *H01L 21/304* (2013.01); *B24B 37/08* (2013.01); *B24B 37/345* (2013.01);
(Continued)

(58) Field of Classification Search
CPC ....... B24B 37/08; B24B 37/28; B24B 37/345; H01L 21/304; H01L 21/67219
(Continued)

(56) References Cited

U.S. PATENT DOCUMENTS 5,653,623 A * 8/1997 Kimura ................. B24B 53/017
451/72
5,679,059 A * 10/1997 Nishi ........................ B08B 1/04
451/41

(Continued)

FOREIGN PATENT DOCUMENTS

JP    H06-252110    9/1994
JP    H08-239230    9/1996
(Continued)

OTHER PUBLICATIONS

Japanese Office Action dated Jan. 23, 2019 issued in Application No. 2018-511394.
(Continued)

*Primary Examiner* — Eileen P Morgan
(74) *Attorney, Agent, or Firm* — KED & Associates LLP (57) ABSTRACT

One aspect of embodiment provides a wafer polishing chamber, including a wafer transfer part; a polishing part provided with an upper surface plate and lower surface plate, and configured to polish the wafer transferred from the wafer transfer part; a partition wall configured to separate positions where the transfer part and the polishing part are disposed; a plurality of fan units configured to introduce air; and a plurality of exhaust units configured to exhaust air, wherein the fan unit may be provided in at least one in an upper portion of the polishing part.

9 Claims, 6 Drawing Sheets

(51) Int. Cl.
*H01L 21/304* (2006.01)
*B24B 53/017* (2012.01)
*H01L 21/02* (2006.01)
*H01L 21/67* (2006.01)

(52) U.S. Cl.
CPC ...... *B24B 53/017* (2013.01); *H01L 21/02002* (2013.01); *H01L 21/67219* (2013.01)

(58) Field of Classification Search
USPC .................................. 451/41, 285, 287, 268
See application file for complete search history.

(56) References Cited

U.S. PATENT DOCUMENTS

| | | | | |
|---|---|---|---|---|
| 6,036,582 | A * | 3/2000 | Aizawa | .................. B23Q 37/00 451/288 |
| 6,042,455 | A * | 3/2000 | Togawa | ................ B24B 37/345 451/45 |
| 6,332,835 | B1 * | 12/2001 | Nishimura | ................ B08B 3/00 451/339 |
| 6,572,730 | B1 * | 6/2003 | Shah | ........................ B24B 37/04 156/345.12 |
| 6,783,427 | B2 * | 8/2004 | Isobe | .................... B24B 37/005 134/902 |
| 8,454,410 | B2 * | 6/2013 | Kitagawa | ............... B24B 37/015 451/285 |
| 9,956,594 | B2 * | 5/2018 | Miura | ................ H01L 21/02065 |
| 2007/0199583 | A1 * | 8/2007 | Choi | ................. H01L 21/67051 134/94.1 |
| 2010/0144249 | A1 * | 6/2010 | Kitagawa | ............... B24B 37/015 451/65 |
| 2016/0184870 | A1 * | 6/2016 | Miura | ............... H01L 21/02065 134/26 |

FOREIGN PATENT DOCUMENTS

| | | |
|---|---|---|
| JP | 2000-158332 | 6/2000 |
| JP | 2005-259967 | 9/2005 |
| JP | 2007-057360 | 3/2007 |
| KR | 10-2004-0070589 | 8/2004 |
| KR | 10-2010-0053091 | 5/2010 |
| KR | 10-2010-0073575 | 7/2010 |

OTHER PUBLICATIONS

International Search Report (with English Translation) and Written Opinion dated Sep. 23, 2016 issued in Application No. PCT/KR2016/000081.

* cited by examiner

WAFER POLISHING CHAMBER AND WAFER POLISHING SYSTEM INCLUDING SAME

CROSS-REFERENCE TO RELATED PATENT APPLICATIONS

This application is a U.S. National Stage Application under 35 U.S.C. § 371 of PCT Application No. PCT/KR2016/000081, filed Jan. 6, 2016, which claims priority to Korean Patent Application No. 10-2015-0186276, filed Dec. 24, 2015, whose entire disclosures are hereby incorporated by reference.

TECHNICAL FIELD

An embodiment relates to a wafer polishing chamber and a wafer polishing system including the same.

BACKGROUND ART

Contents described in this specification merely provide background information of an embodiment and do not constitute the related art.

Recently, with a high integration of semiconductors, information processing per unit area and storage capacity have been increased, which has required a large diameter of a semiconductor wafer, refinement of a circuit line width, and multilayer of a wiring. In order to form a wiring of multilayer on a semiconductor wafer, a high degree of planarization of a wafer is required, and a wafer planarization process is required for such a high degree of planarization.

One of wafer planarization processes is a wafer polishing process. The wafer polishing process is a process of polishing upper and lower surfaces of a wafer by polishing pads. That is, a wafer to be polished is disposed between an upper surface plate and a lower surface plate on which the polishing pad is attached, and the upper surface plate and/or the lower surface plate are rotated so as to polish upper and lower surfaces of the wafer.

The wafer polishing process may be performed in a wafer polishing chamber provided with various devices including the upper surface plate and the lower surface plate.

Meanwhile, a large amount of particles generated during a polishing process may exist in the wafer polishing chamber. Since these particles adhere to the wafer and cause defects, it is necessary to smoothly exhaust the particles to outside of the polishing chamber.

DISCLOSURE

Technical Problem

Accordingly, an embodiment relates to a wafer polishing chamber having a structure capable of smoothly exhausting a large amount of particles generated during a polishing process to outside, and a wafer polishing system including the same.

The technical problem to be solved by embodiments is not limited to those mentioned above and other unmentioned technical problems should be clearly understood by those of ordinary skill in the art to which embodiments pertain from the description below.

Technical Solution

One aspect of embodiment provides a wafer polishing chamber, including a wafer transfer part; a polishing part provided with an upper surface plate and lower surface plate, and configured to polish the wafer transferred from the wafer transfer part; a partition wall configured to separate positions where the transfer part and the polishing part are disposed; a plurality of fan units configured to introduce air; and a plurality of exhaust units configured to exhaust air, wherein the fan unit may be provided in at least one in an upper portion of the polishing part.

The exhaust unit may be provided in at least one in a lower portion of the polishing part.

The fan unit may be disposed in at least one between the lower surface plate and an outer wall of the wafer polishing chamber.

The exhaust unit may be disposed in at least one to be opposite to the fan unit between the lower surface plate and an outer wall of the wafer polishing chamber.

The fan unit and the exhaust unit may be respectively disposed in at least one in the transfer part.

The fan unit and the exhaust unit disposed in the polishing part may be disposed opposite to each other in a vertical direction of the chamber.

Another aspect of embodiment provides a wafer polishing chamber, including a wafer transfer part; a polishing part provided with an upper surface plate and lower surface plate, and configured to polish the wafer transferred from the wafer transfer part; a partition wall configured to separate positions where the transfer part and the polishing part are disposed; a plurality of fan units configured to introduce air; and a plurality of exhaust units configured to exhaust air, wherein an air introducing amount by the fan unit may be smaller than an air exhausting amount by the exhaust unit.

In another aspect of embodiment, the wafer polishing chamber may be able to maintain a negative pressure state inside thereof, during a polishing process of the wafer.

In one aspect of embodiment, a wafer polishing system may include a wafer polishing chamber including a wafer transfer part, a polishing part configured to polish the wafer transferred from the wafer transfer part, a plurality of fan units configured to introduce air, and a plurality of exhaust units configured to exhaust air; and a controller configured to control at least one of an air velocity, an air pressure, and an air flow rate of the fan unit and the exhaust unit.

In one aspect of embodiment, the wafer polishing system may further include an airflow measuring device electrically connected to the controller and configured to measure a state of distribution and/or floating of particles in the wafer polishing chamber.

The airflow measuring device may be disposed outside the wafer polishing chamber and provided to be movable.

The airflow measuring device may include a light irradiation unit configured to irradiate light into the wafer polishing chamber; and a photographing unit configured to photograph an irradiated light region in which light irradiated from the light irradiation unit is formed in the wafer polishing chamber.

The controller may be electrically connected to the fan unit and the exhaust unit, and may control the fan unit and the exhaust unit according to airflow information received from the airflow measuring device.

Advantageous Effects

In an embodiment, when an air exhausting amount in the wafer polishing chamber is larger than an air introducing amount therein, a relatively large amount of air may be exhausted to the outside through the exhaust unit. Accordingly, particles existed in the wafer polishing chamber can be effectively exhausted to the outside.

In an embodiment, since the fan unit and the exhaust unit disposed between the lower surface plate and an outer wall of the wafer polishing chamber effectively eliminate a stagnant space in which a vortex is formed, particles existing in the wafer polishing chamber may be effectively exhausted to the outside, thereby preventing particles from being reabsorbed on a wafer.

In an embodiment, the fan unit and the exhaust unit provided so as to be opposed to each other in a vertical direction may more effectively eliminate a stagnant space, which may occur between the lower surface plate and an outer wall of the wafer polishing chamber.

In an embodiment, since the airflow measuring device and the controller acquire the airflow information inside the wafer polishing chamber and thereby control the fan unit and the exhausting unit, it is possible to easily recognize an occurrence of a stagnant space at a specific portion inside the wafer polishing chamber and the stagnant space may be easily eliminated.

MODES OF THE INVENTION

Hereinafter, embodiments will be described with reference to the accompanying drawings. The embodiments can be modified in various ways and can have various forms, and specific embodiments are illustrated in the drawings and described in detail in the description. However, this is not intended that the embodiments be limited to any particular type of disclosure, and it should be understood that the invention is intended to cover all modifications, equivalents, and alternatives falling within the spirit and scope of the embodiments. In this process, the size and shape of the components shown in the drawings may be exaggerated for clarity and convenience of explanation.

Although terms such as "first", "second", etc. can be used to describe various components, the above-mentioned components should not be limited by the above terms. The above terms are only used to distinguish one component from another. In addition, the terms specifically defined in consideration of the configuration and operation of the embodiment are merely for describing the embodiments, and do not limit the scope of the embodiment.

In the description of embodiments, it should be understood that when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Further, the relational terms such as "over/upper portion/above," and "below/lower portion/under" do not necessarily require or include any physical or logical relationship or sequence between devices or elements, and may also be used only to distinguish one device or element from another device or element.

Figure 1A:
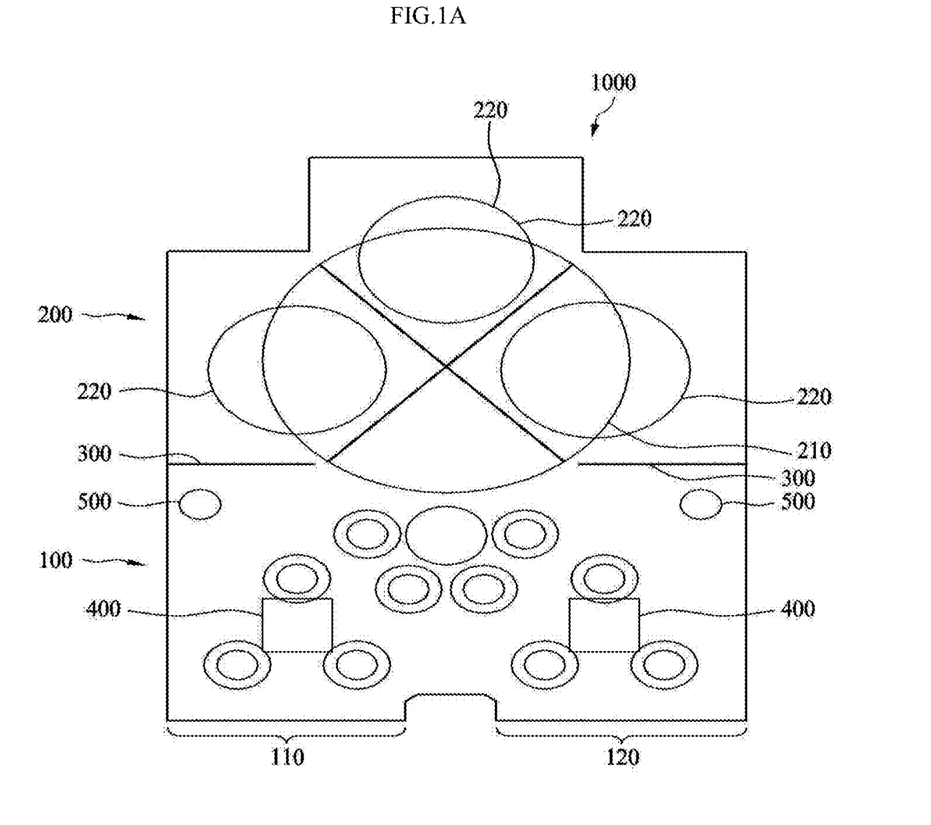
FIG. 1A is a schematic plan view illustrating a wafer polishing chamber according to an embodiment.
Figure 1B:
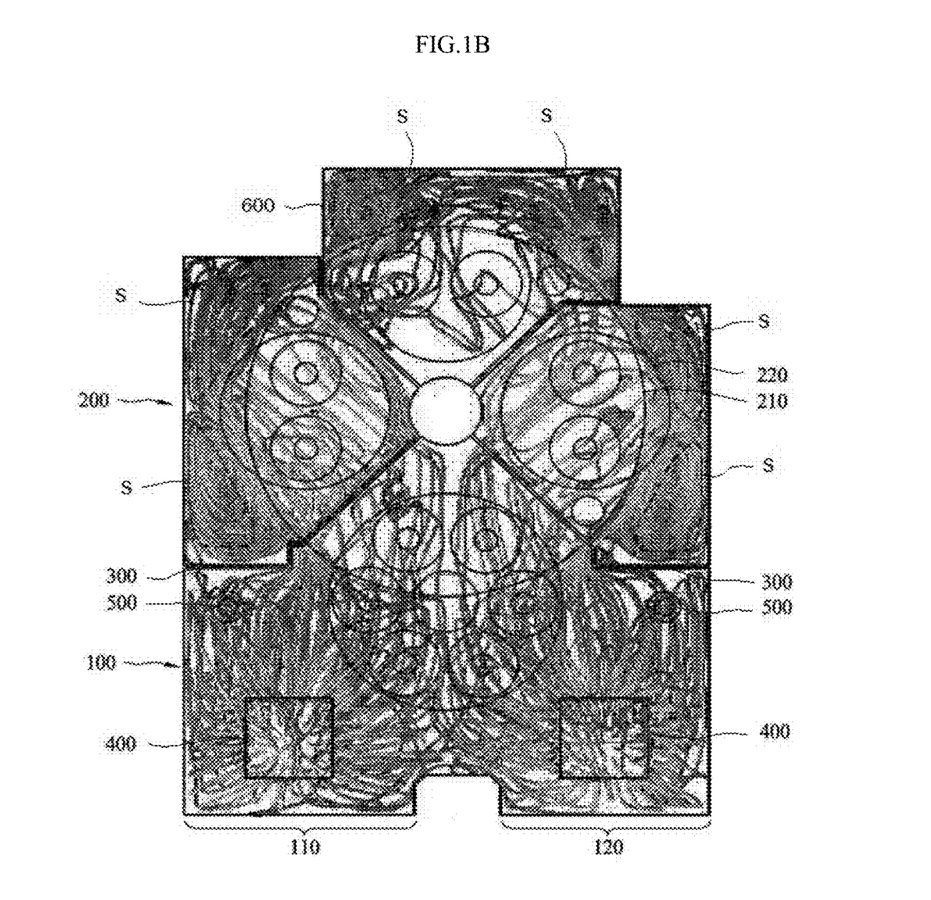
FIG. 1B is a graph illustrating a simulation result of an air flow inside a wafer polishing chamber according to an embodiment.

FIG. 1A is a schematic plan view illustrating a wafer polishing chamber 1000 according to an embodiment. FIG. 1B is a graph illustrating a simulation result of an air flow inside a wafer polishing chamber according to an embodiment.

A portion shown in FIG. 1B as a stream line represents a state in which an air flow in the wafer polishing chamber 1000 is at an atmospheric pressure. The stream line is a simulation result via computer programming.

As shown in FIGS. 1A and 1B, the wafer polishing chamber 1000 of an embodiment may include a transfer part 100, a polishing part 200, a partition wall 300, a fan unit 400, and an exhaust unit 500.

The transfer part 100 may load a wafer (not shown) to be polished into the wafer polishing chamber 1000, may function to unload the wafer, which has been polished, to an outside of the wafer polishing chamber 1000, and may include a loading unit 110 and an unloading unit 120.

The loading unit 110 is a portion for loading a disk or a plate-shaped wafer, which has been sliced from an ingot type, into the wafer polishing chamber 1000. The unloading unit 120 is a portion for unloading the wafer, which has been polished, to an outside of the wafer polishing chamber 1000.

A transfer device capable of loading or unloading the wafer in the loading unit 110 and the unloading unit 120 and transferring the wafer between the loading unit 110 and the polishing part 200, equipment capable of picking up or dropping the wafer, and other equipment necessary for handling wafers may be provided.

The polishing part 200 is a portion in which the wafer transferred from the transfer part 100 is polished and, and may be provided with an upper surface plate 210 and a lower surface plate 220 configured to polish the wafer.

For example, the wafer may be disposed between the upper surface plate 210 and the lower surface plate 220, and both sides of the wafer may be polished as the upper surface plate 210 and/or the lower surface plate 220 rotate. A polishing pad may be disposed on surfaces of the upper surface plate 210 and the lower surface plate 220, and the wafer polishing process may be performed in a manner that such polishing pads polish both surfaces of the wafer.

In this case, for example, the lower surface plate 220 may be provided in plural, and a polishing pad having different surface roughness may be disposed on each lower surface plate 220 and polish the wafer sequentially so as to complete the wafer polishing process. Of course, the number of the lower surface plates 220 may be appropriately selected in consideration of an overall structure of a wafer polishing apparatus, a size of a wafer to be polished, and the like.

The partition wall 300 may be formed between the transfer part 100 and the polishing part 200 and may function to separate positions where the transfer part 100 and the polishing part 200 are disposed.

Since the transfer part 100 and the polishing part 200 have different functions and structures as described above, they need to be separately arranged in the wafer polishing chamber 1000, and the partition wall 300 may function to separate the transfer part 100 and the polishing part 200.

The fan unit 400 may function to introduce air into the wafer polishing chamber 1000. The exhaust unit 500 may function to exhaust air in the wafer polishing chamber 1000. At this point, the exhaust unit 500 may be provided with, for example, an exhaust pipe and a valve installed in the exhaust pipe, and the valve may be, for example, a flow rate control valve.

A large amount of particles may be generated in the wafer polishing chamber 1000 during the polishing process. Such particles may be generated by being separated from a wafer to be polished, may be generated by floating a slurry-type polishing material supplied to the upper surface plate 210, may be generated by injecting particles contained in deionized water due to injecting high pressure deionized water or the like in a process of dressing a lower surface plate polishing pad, and may be generated by other causes.

Such particles may adversely affect an operation of various equipment installed in the wafer polishing chamber 1000, and in particular, may be adhered to a surface of a wafer to be polished.

Particles adhered to a wafer surface are strongly adhered to the wafer surface as the polishing process proceeds and remain as defects on the surface of the wafer, which is called a polishing induced defect (PID).

In order to remove such a PID, an inside of the wafer polishing chamber 1000 is required to exhaust particles existing in the wafer polishing chamber 1000 to outside via continuous ventilation.

For this reason, since the fan unit 400 and the exhaust unit 500 are installed in the wafer polishing chamber 1000 and continuously ventilate the inside of the wafer polishing chamber 1000, the particles generated during the polishing process can be exhausted to the outside.

At this point, for example, as shown in FIGS. 1A and 1B, the fan unit 400 may be installed in an upper portion of the wafer polishing chamber 1000 and the exhaust unit 500 may be installed in a lower portion of the wafer polishing chamber 1000.

In addition, the fan unit 400 and the exhaust unit 500 may be provided in at least one in the wafer polishing chamber 1000, for example, as shown in FIGS. 1A and 1B, the fan unit 400 and the exhaust unit 500 may be respectively disposed in the transfer part 100 in plural.

However, the fan unit 400 and the exhaust unit 500 may cause the following problems. As described above, a portion shown in FIG. 1B as a stream line represents a state in which an air flow in the wafer polishing chamber 1000 is at an atmospheric pressure. The stream line is a simulation result via computer programming.

Reviewing the stream line of FIG. 1B, a stagnant space S in which a vortex is formed may occur in the wafer polishing chamber 1000 even through the fan unit 400 and the exhaust unit 500 operate. In the stagnant space S, air introduced via the fan unit 400 is not exhausted smoothly via the exhaust unit 500 but stays therein.

When such a stagnant space S occurs, since particles staying in the stagnant space S are not exhausted to the outside, and such particles are adhered to the wafer during the polishing process, the PID may be generated.

As shown in FIG. 1B, the stagnant space S may mainly occur in the polishing part 200 in which the upper surface plate 210 and the lower surface plate 220 are disposed. For example, the stagnant space S may mainly occur between the lower surface plate 220 and an outer wall 600 of the wafer polishing chamber 1000 in the polishing part 200.

This is because the fan unit 400 or the exhaust unit 500 is not provided in the polishing part 200 and air flow to the fan unit 400 and the exhaust unit 500 disposed in the transfer part 100 is blocked by the partition wall 300.

Therefore, it is necessary to smoothly flow air in the wafer polishing chamber 1000 so as to effectively exhaust particles existing in the wafer polishing chamber 1000.

In order to meet such a necessity, the wafer polishing chamber 1000 of an embodiment may be provided such that an air introducing amount by the fan unit 400 is smaller than an air exhausting amount by the exhaust unit 500.

For example, by controlling a rotational speed (RPM) of the fan unit 400 so as to control an air velocity, an air pressure, an air flow rate, or the like of air introduced by the fan unit 400, an air introducing amount by the fan unit 400 may be controlled.

In addition, for example, by controlling a degree of opening of a valve installed in the exhaust unit 500 so as to control an air velocity, an air pressure, air flow rate, or the like of air exhausted by the exhaust unit 500, an air exhausting amount by the exhaust unit 500 may be controlled.

According to such a structure, when an air exhausting amount in the wafer polishing chamber 1000 is larger than an air introducing amount therein, a relatively large amount of air may be exhausted to the outside via the exhaust unit 500. Accordingly, particles existing in the wafer polishing chamber 1000 can be effectively exhausted to the outside.

In an embodiment, the inside of the wafer polishing chamber 1000 may be maintained at a negative pressure state, during a polishing process of the wafer. That is, since an air introducing amount introduced by the fan unit 400 is smaller than an air exhausting amount exhausted by the exhaust unit 500, the inside of the wafer polishing chamber 1000 may be maintained at a negative pressure in a state in which the pressure is lower than an ambient atmospheric pressure.

Figure 2:
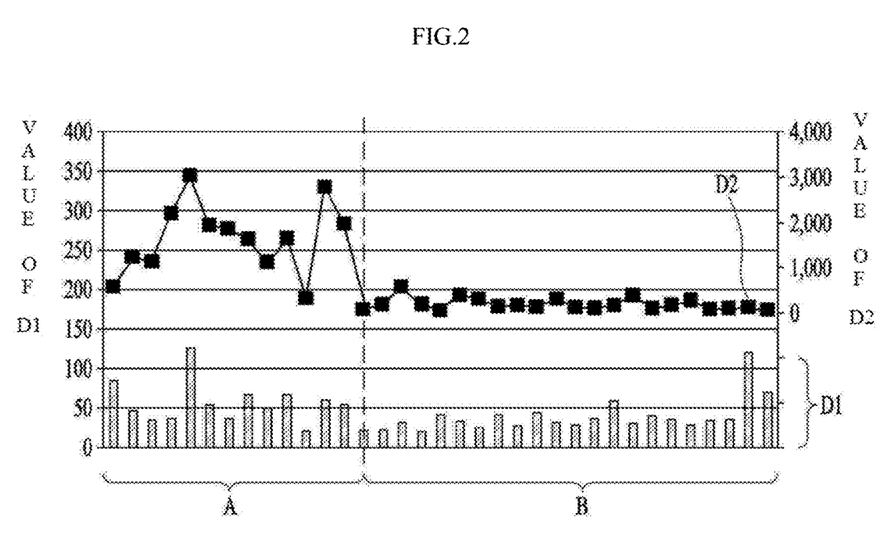
FIG. 2 is a graph for describing experimental results of a wafer polishing chamber according to an embodiment.

FIG. 2 is a graph for describing experimental results of the wafer polishing chamber 1000 according to an embodiment. FIG. 2 is an experimental result in a state in which the inside of the wafer polishing chamber 1000 having the structure shown in FIG. 1 is at a negative pressure state, that is, in a state in which an air introducing amount introduced by the fan unit 400 is maintained smaller than an air exhausting amount exhausted by the exhaust unit 500.

In the graph, a vertical axis represents the number of PIDs found when measuring a wafer surface with laser scattering equipment and having a maximum length of about 26 nm or more. Such a PID may be present on a wafer surface in a protruding or recessed shape.

In the graph, a horizontal axis represents each wafer. That is, one of points shown in curved data and bar data refers to each of wafers tested. In the horizontal axis of the graph, section A is an experimental result measured in a state in which the inside of the wafer polishing chamber 1000 is at atmospheric pressure, and section B is an experimental result in a state in which the inside of the wafer polishing chamber 1000 is at a negative pressure.

In the graph, a bar data D1 represents the number of PIDs found when a wafer on which a polishing process has been completed is cleaned once, and a curve data D2 represents a value obtained by subtracting the number of PIDs found when a wafer on which a polishing process has been completed is cleaned once from the number of PIDs found when a wafer on which a polishing process has been completed is cleaned six times.

At this point, referring to the drawing, a numerical value of the bar data D1 is a value shown on a left vertical axis, and a numerical value of the curve data D2 is a value shown on a right vertical axis.

As can be seen from the graph, the number of PIDs may increase as cleaning of a wafer is repeated. This is because a cleaning agent used for cleaning etches a surface of the wafer to some extent, and the PIDs are further prominent when cleaning of a wafer is repeated by such an etching action.

That is, since a maximum length of the PID, which is less than about 26 nm and thus not detected by the laser scattering equipment when cleaned once, becomes about 26 nm or more due to the etching action of the cleaning agent as the number of cleanings increases, the number of PIDs found increases when the cleaning of the wafer is repeated.

In the graph, when comparing the section A and the section B, it can be seen that the number of PIDs in the section B of D1 is smaller than that of the section A of D1 on an average. In addition, it can be seen that a value of the section B of D2 is shown as smaller than that of the section A.

In particular, it can be seen that a value of D2, that is, the value obtained by subtracting the number of PIDs found when a wafer on which a polishing process has been completed is cleaned once from the number of PIDs found when a wafer on which a polishing process has been completed is cleaned six times in the B section of D2 is significantly smaller than that in the section A of D2.

Reviewing experimental results, when the wafer polishing process is performed in a state in which the wafer polishing chamber 1000 is at a negative pressure than an atmospheric pressure, the number of PIDs by particles existing in the wafer polishing chamber 1000 is significantly reduced.

Figure 3:
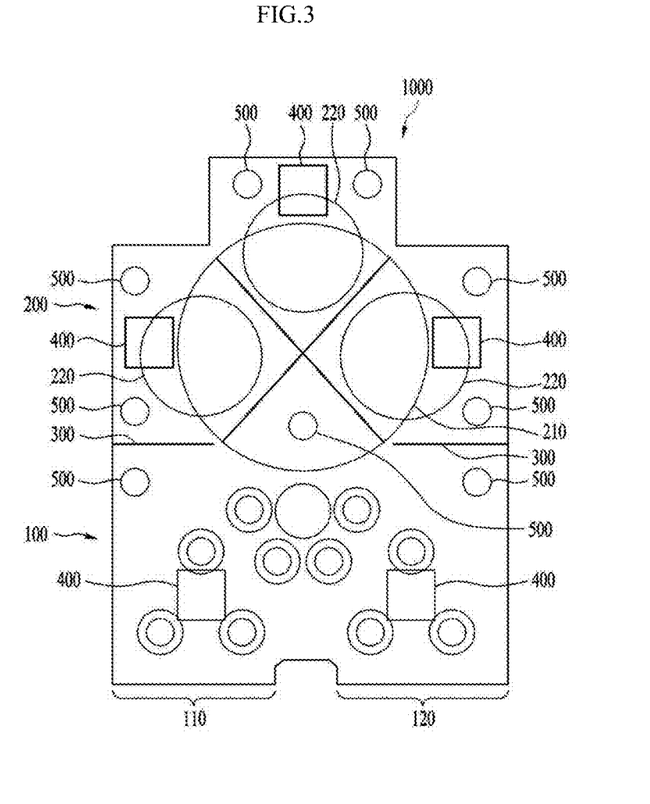
FIG. 3 is a schematic plan view illustrating a wafer polishing chamber according to another embodiment.

FIG. 3 is a schematic plan view illustrating a wafer polishing chamber 1000 according to another embodiment. As shown in FIG. 3, in an embodiment, the fan unit 400 and the exhaust unit 500 may be provided in the polishing part 200.

In an embodiment, the fan unit 400 may be provided in at least one in an upper portion of polishing part 200. In an embodiment, the exhaust unit 500 may be provided in at least one in a lower portion of the polishing part 200.

In FIG. 3, three lower surface plates 220 are provided as one embodiment. Therefore, the fan units 400 are provided in total of three, that is, one in one of the lower surface plates 220. Therefore, the exhaust units 500 are provided in total of six, that is, two in one of the lower surface plates 220.

However, the number of the fan units 400 and the number of the exhaust units 500 are only one embodiment, and the number of the fan units 400 and the number of the exhaust units 500 can be appropriately selected by considering structures and sizes of the fan unit 400 and the exhaust unit 500, structures and sizes of the upper and lower polishing plates 210 and 220, and an overall structure and size of the wafer polishing chamber 1000.

Meanwhile, as shown in FIG. 3, the exhaust unit 500 may be disposed between the partition walls 300, that is, at a portion where the transfer part 100 and the polishing part 200 are not separated from each other.

For example, the fan unit 400 may be disposed between the lower surface plate 220 and the outer wall 600 of the wafer polishing chamber 1000. As described with reference to FIG. 1, since the stagnant space S in which a vortex is generated may be formed between the lower surface plate 220 and the outer wall 600 of the wafer polishing chamber 1000, this is for dissipating the stagnant space S using the fan unit 400.

Since the stagnant space S is eliminated, it is possible to prevent air and particles from staying in the stagnant space S.

For example, the exhaust unit 500 may be disposed between the lower surface plate 220 and the outer wall 600 of the wafer polishing chamber 1000. Like the fan unit 400, since the stagnant space S in which a vortex is generated is eliminated between the lower surface plate 220 and the outer wall 600 of the wafer polishing chamber 1000, air and particles can be prevented from staying.

In an embodiment, since the fan unit 400 and the exhaust unit 500 disposed between the lower surface plate 220 and the outer wall 600 of the wafer polishing chamber 1000 effectively eliminate the stagnant space S in which a vortex is formed, particles existing in the wafer polishing chamber 1000 can be effectively exhausted to the outside.

For example, the fan unit 400 and the exhaust unit 500 disposed between the lower surface plate 220 and the outer wall 600 of the wafer polishing chamber 1000 may be provided so as to be opposite to each other in a vertical direction of the wafer polishing chamber 1000. At this point, the fan unit 400 may be disposed in an upper portion of the wafer polishing chamber 1000, and the exhaust unit 500 may be disposed in a lower portion of the wafer polishing chamber 1000, respectively.

According to such a structure, the fan unit 400 and the exhaust unit 500 provided so as to be opposite to each other in a vertical direction may more effectively eliminate the stagnant space S that may occur between the lower surface plate 220 and the outer wall 600 of the wafer polishing chamber 1000.

This is because, since the fan unit 400 configured to introduce air is provided directly at an upper portion of the stagnant space S and the exhaust unit 500 configured to exhaust air is provided directly at a lower portion of the stagnant space S, a strong flow may occur from an upper side to a lower side in the stagnant space S.

Meanwhile, also in an embodiment shown in FIG. 3, an inside of the wafer polishing chamber 1000 may be provided to be maintained at a negative pressure when the wafer polishing process is performed. That is, the wafer polishing chamber 1000 of an embodiment may be provided such that an overall air introducing amount by the plurality of fan units 400 is smaller than an overall air exhausting amount by the plurality of exhaust units 500.

Figure 4:
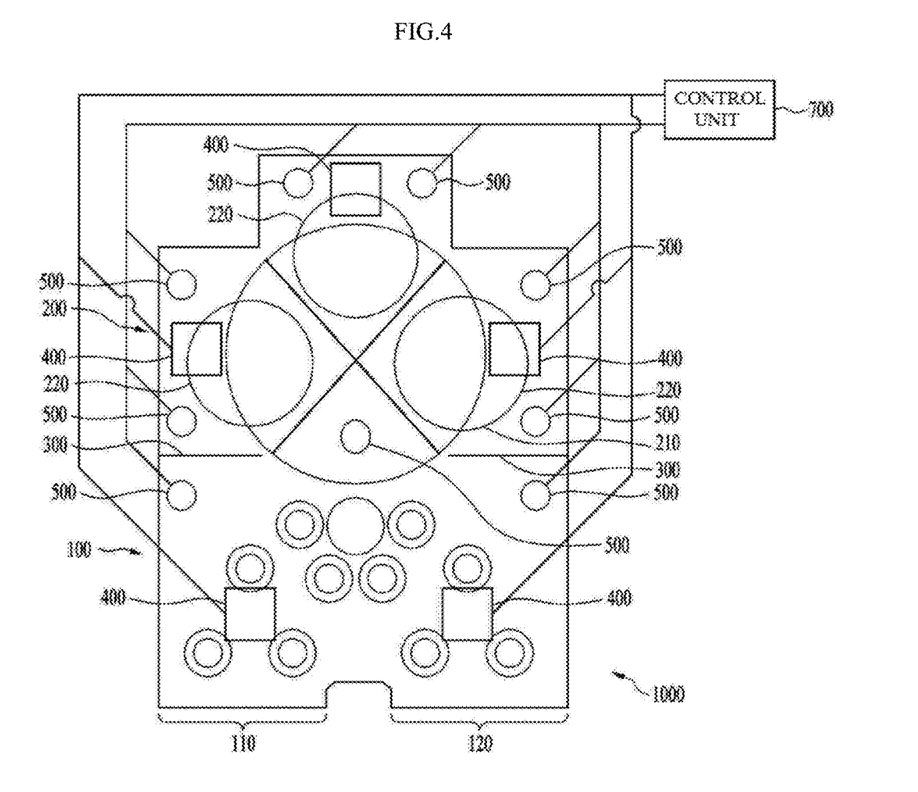
FIG. 4 is a view for describing a wafer polishing system according to an embodiment.

FIG. 4 is a view for describing a wafer polishing system according to an embodiment. The wafer polishing system of an embodiment may include the wafer polishing chamber 1000 and a controller 700.

The controller 700 may control at least one of an air velocity, an air pressure, and an air flow rate of the fan unit 400 and the exhaust unit 500, and may also control an air inflow amount by the fan unit 400 and an air exhausting amount by the exhaust unit 500.

As shown in FIG. 4, the controller may be electrically connected to the plurality of fan units 400 and exhaust units 500, and may transmit control signals to the fan unit 400 and the exhaust unit 500.

The controller may control an inside of the wafer polishing chamber 1000 to be maintained at a negative pressure when the wafer polishing process is performed. If necessary, an operation of each of the fan unit 400 and the exhaust unit 500 may be separately controlled.

For example, the controller may control a rotational speed (RPM) of the fan unit 400 so as to control an air velocity, an air pressure, an air flow rate, or the like of air introduced by the fan unit 400, and control an air introducing amount by the fan unit 400.

For example, the controller may control a degree of opening of a valve installed in the exhaust unit 500 to control an air velocity, an air pressure, an air flow rate, or the like of the air exhausted by the exhaust unit 500, and control an air exhausting amount by the exhaust unit 500.

At this point, the exhaust unit 500 may be provided with, for example, a plurality of branch pipes provided in the wafer polishing chamber 1000 and a main pipe in which the branch pipes are joined together. In such a structure of the exhaust unit 500, the valve may be provided in the main pipe, and the controller 700 may control the exhaust unit 500 in such a manner as to control a degree of opening of the valve.

In another embodiment, the valves are independently installed in each of the branch pipes, and the controller 700 may control the exhaust unit 500 in such a manner that a degree of opening of each of the valves is individually controlled. In this case, the exhaust unit may not be provided with a main pipe.

Meanwhile, although not shown, a pressure sensor may be provided in the wafer polishing chamber 1000. The pressure sensor may be provided at a plurality of locations in the polishing chamber 1000 to measure pressure in the polishing chamber 1000.

Since the controller 700 is connected to the pressure sensor and receives information on the pressure in the wafer polishing chamber 1000 from the pressure sensor to control the fan unit 400 and the exhaust unit 500, the inside of the wafer polishing chamber 1000 may be maintained at a negative pressure during a polishing process.

Figure 5:
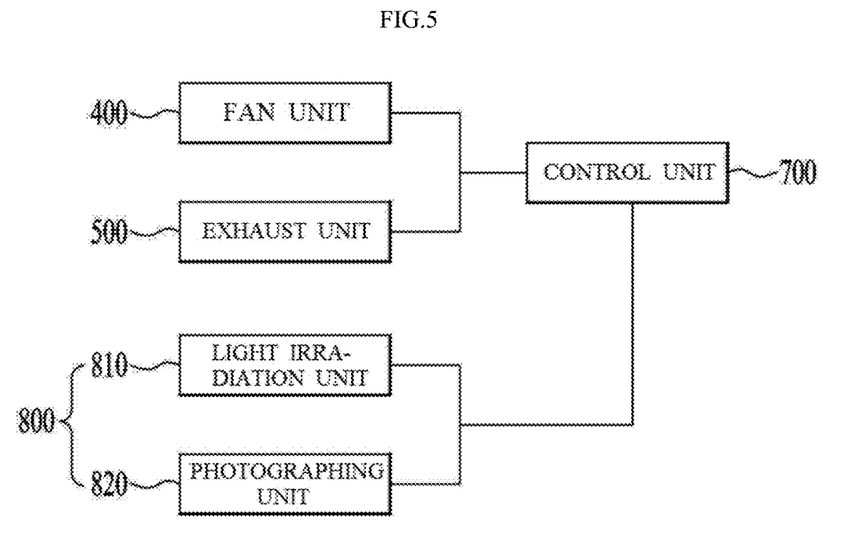
FIG. 5 is a view for describing a wafer polishing system according to another embodiment.

FIG. 5 is a view for describing a wafer polishing system according to another embodiment. Of course, the wafer polishing system of an embodiment shown in FIG. 5 may include the wafer polishing chamber 1000 and the controller 700 shown in FIG. 4.

The wafer polishing system of an embodiment may further include an airflow measuring device 800. The airflow measuring device 800 may be electrically connected to the controller 700, may measure a state of distribution and/or floating of particles in the wafer polishing chamber 1000, and may include a light irradiation unit 810 and a photographing unit 820.

For example, the airflow measuring device 800 may measure a flow direction and velocity of air and/or particles in the wafer polishing chamber 1000, and may measure a state of distribution and/or floating of the particles through the measured data.

The light irradiation unit 810 may function to irradiate light into the wafer polishing chamber 1000. The light irradiated by the light irradiation unit 810 may be any light such as laser or infrared rays capable of measuring a flow direction, flow velocity, and the like of air and/or particles in the wafer polishing chamber 1000.

The photographing unit 820 may be configured to photograph an irradiated light region in which light irradiated from the light irradiation unit 810 is formed in the wafer polishing chamber 1000. The photographing unit 820 may be any cameras such as a camera configured to photograph a visible ray region or that configured to photograph an infrared ray region capable of obtaining information on a flow direction, flow velocity, and the like of air and/or particles.

The controller 700 may be connected to the light irradiation unit 810 and the photographing unit 820. The controller 700 may transmit an operation signal to the light irradiation unit 810 so that the light irradiation unit 810 can irradiate light into the wafer polishing chamber 1000.

The controller 700 may transmit an operation signal to the photographing unit 820 so that the photographing unit 820 may photograph an area where the light irradiation unit 810 irradiates light into the wafer polishing chamber 1000. The controller 700 may receive information on a flow direction, flow velocity, and the like of air and/or particles in the wafer polishing chamber 1000, that is, airflow information from the photographing unit 820.

The controller 700 may be electrically connected to the fan unit 400 and the exhaust unit 500 and may control the fan unit 400 and the exhaust unit 500 according to airflow information received from the airflow measuring device 800.

At this point, for example, when a stagnant space S exists in the wafer polishing chamber 1000 according to the airflow information, an air velocity, an air pressure, an air flow rate, or the like of the fan unit 400 and the exhaust unit may be controlled to eliminate the stagnant space S.

Meanwhile, the airflow measuring device 800 may be disposed outside the wafer polishing chamber 1000 and provided to be movable. When the airflow measuring device 800 is disposed in the wafer polishing chamber 1000, it may be difficult to find a space for disposing the airflow measuring device 800 and particles existing in the wafer polishing chamber 1000 may cause malfunction or failure of the airflow measuring device 800.

In addition, when the airflow measuring device 800 is disposed outside the wafer polishing chamber 1000, since it is easy to move, it is possible to easily determine whether a stagnant space S is generated in a specific area in the wafer polishing chamber 1000 by measuring while moving in each portion in the wafer polishing chamber 1000.

In an embodiment, since the airflow measuring device 800 and the controller 700 acquire airflow information in the wafer polishing chamber 1000 and control the fan unit 400 and the exhaust unit 500 accordingly, it is possible to easily identify an occurrence of a stagnant space S in a specific region in the wafer polishing chamber 1000 and to easily eliminate the stagnant space S.

While only a few are described above in connection with the embodiments, in addition to this, various other forms of implementation are possible. The technical contents of the embodiments described above may be combined in various forms except for a case of mutually incompatible technology, and may be implemented in a new embodiment through the same.

INDUSTRIAL APPLICABILITY

In an embodiment, when an air exhausting amount in the wafer polishing chamber is larger than an air introducing amount therein, a relatively large amount of air may be exhausted to outside via the exhaust unit. Accordingly, particles existing in the wafer polishing chamber can be effectively exhausted to the outside. Therefore, there is an industrial applicability.

The invention claimed is:

1. A wafer polishing chamber, comprising:
   a wafer transfer part;
   a polishing part provided with an upper surface plate and a lower surface plate, and configured to polish a wafer transferred from the wafer transfer part;
   a partition wall configured to separate a position where the transfer part is disposed from a position where the polishing part is disposed;
   a fan unit configured to introduce air; and
   an exhaust unit configured to exhaust air,
   wherein the fan unit is provided in an upper portion of the polishing part, wherein the exhaust unit is provided in a lower portion of the polishing part, and wherein the fan unit and the exhaust unit disposed in the polishing part are disposed opposite to each other in a vertical direction of the wafer polishing chamber.

2. The wafer polishing chamber of claim 1, wherein the fan unit is disposed between the lower surface plate and an outer wall of the wafer polishing chamber.

3. The wafer polishing chamber of claim 2, wherein the exhaust unit is disposed to be opposite to the fan unit between the lower surface plate and the outer wall of the wafer polishing chamber.

4. The wafer polishing chamber of claim 1, wherein the fan unit and the exhaust unit are respectively disposed in the wafer transfer part.

5. A wafer polishing chamber, comprising:
a wafer transfer part;
a polishing part provided with an upper surface plate and a lower surface plate, and configured to polish a wafer transferred from the wafer transfer part;
a partition wall configured to separate a position where the transfer part is disposed from a position where the polishing part is disposed;
a fan unit configured to introduce air; and
an exhaust unit configured to exhaust air,
wherein the fan unit is provided in an upper portion of the polishing part,
wherein the exhaust unit is provided in a lower portion of the polishing part,
wherein the fan unit and the exhaust unit disposed in the polishing part are disposed opposite to each other in a vertical direction of the wafer polishing chamber, and
wherein an air introducing amount by the fan unit is smaller than an air exhausting amount by the exhaust unit.

6. The wafer polishing chamber of claim 5, wherein during a polishing process of the wafer, the wafer polishing chamber is to maintain a negative pressure state inside the wafer polishing chamber.

7. A wafer polishing system, comprising:
a wafer polishing chamber comprising a wafer transfer part, a polishing part configured to polish a wafer transferred from the wafer transfer part, a plurality of fan units configured to introduce air, and a plurality of exhaust units configured to exhaust air;
a controller configured to control at least one of an air velocity, an air pressure, and an air flow rate of the fan unit and the exhaust unit, and
an airflow measuring device electrically connected to the controller and configured to measure a state of distribution and/or floating of particles in the wafer polishing chamber,
wherein the controller is electrically connected to the fan unit and the exhaust unit, and is configured to control the fan unit and the exhaust unit according to airflow information received from the airflow measuring device.

8. The wafer polishing system of claim 7, wherein the airflow measuring device is disposed outside the wafer polishing chamber and is movable with respect to the wafer polishing chamber.

9. The wafer polishing system of claim 7, wherein the airflow measuring device comprises:
a light irradiation unit configured to irradiate light into the wafer polishing chamber; and
a photographing unit configured to photograph an irradiated light region in which light irradiated from the light irradiation unit is formed in the wafer polishing chamber.

* * * * *